[US009435699B2](#)

(12) United States Patent
Ten-Have

(10) Patent No.: US 9,435,699 B2
(45) Date of Patent: Sep. 6, 2016

(54) METHOD FOR PRODUCING A MICROELECTROMECHANICAL DEVICE AND MICROELECTROMECHANICAL DEVICE

(71) Applicant: Elmos Semiconductor AG, Dortmund (DE)

(72) Inventor: Arnd Ten-Have, Dortmund (DE)

(73) Assignee: ELMOS Semiconductor AG, Dortmund (DE)

( * ) Notice: Subject to any disclaimer, the term of this patent is extended or adjusted under 35 U.S.C. 154(b) by 0 days.

(21) Appl. No.: 14/689,685

(22) Filed: Apr. 17, 2015

(65) Prior Publication Data
US 2015/0219507 A1   Aug. 6, 2015

Related U.S. Application Data

(63) Continuation of application No. 13/583,384, filed as application No. PCT/EP2011/054220 on Mar. 21, 2011, now Pat. No. 9,034,680.

(30) Foreign Application Priority Data

Mar. 22, 2010 (EP) .................................. 10157193

(51) Int. Cl.
*H01L 29/84* (2006.01)
*G01L 1/16* (2006.01)
(Continued)

(52) U.S. Cl.
CPC ............. *G01L 1/16* (2013.01); *B81C 1/00246* (2013.01); *B81C 1/00626* (2013.01);
(Continued)

(58) Field of Classification Search
USPC ........ 257/254, 415, 417, 414, 252, E33.056, 257/E33.058, E33.059, E27.062, E23.001, 257/E29.234
See application file for complete search history.

(56) References Cited

U.S. PATENT DOCUMENTS 8,183,078 B2   5/2012   Ollier et al.
9,034,680 B2   5/2015   Ten-Have
(Continued)

FOREIGN PATENT DOCUMENTS

DE   102008035055 B3   12/2009
WO   2009071595 A2   6/2009

OTHER PUBLICATIONS

International Search Report of International Application No. PCT/EP2011/054220, dated Feb. 3, 2012, 5 pp.
(Continued)

*Primary Examiner* — Timor Karimy
(74) *Attorney, Agent, or Firm* — Shumaker & Sieffert, P.A.

(57) ABSTRACT

The invention relates to a method for producing a microelectromechanical device in a material substrate suitable for producing integrated electronic components, in particular a semiconductor substrate, wherein a material substrate (12, 14,16) is provided on which at least one surface structure (26) is to be formed during production of the device. An electronic component (30) is formed in the material substrate (12,14,16) using process steps of a conventional method for producing integrated electronic components. A component element (44) defining the position of the electronic component (30) and/or required for the function of the electronic component (30) is selectively formed on the material substrate (12,14,16) from an etching stop material acting as an etching stop in case of etching of the material substrate (12,14,16) and/or in case of etching of a material layer (52) disposed on the material substrate (12,14,16). When the component element (44) of the electronic component (30) is implemented, a bounding region (48) is also formed on the material substrate (12,14,16) along at least a partial section of an edge of the surface structure (26), wherein said bounding region bounds said partial section. The material substrate (12,14, 16) thus implemented is selectively etched for forming the surface structure (26), in that the edge of the bounding region (48) defines the position of the surface structure (26) to be implemented on the material substrate (12, 14,16).

10 Claims, 7 Drawing Sheets

Figure 1:
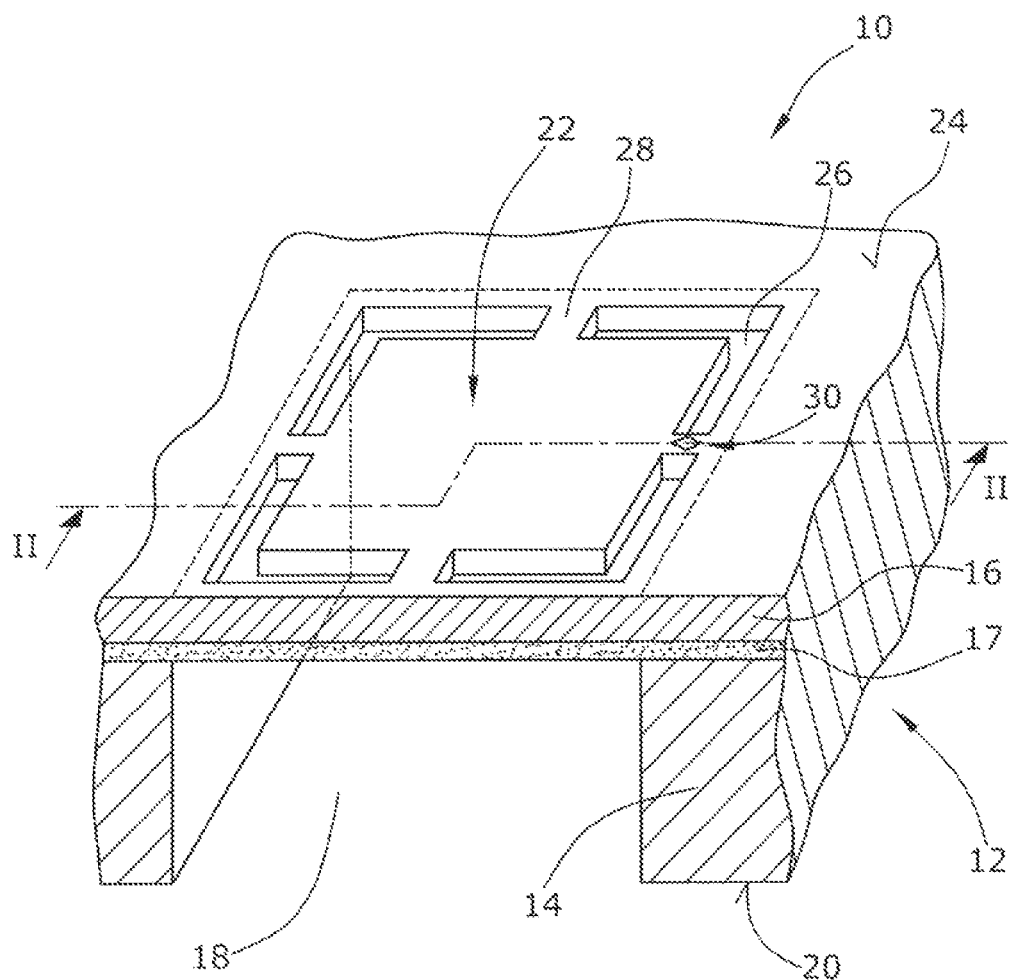

(51) Int. Cl.
*B81C 1/00* (2006.01)
*G01L 9/00* (2006.01)
*H01L 27/20* (2006.01)
*H01L 29/66* (2006.01)

(52) U.S. Cl.
CPC .......... *G01L 9/0047* (2013.01); *G01L 9/0054* (2013.01); *G01L 9/0098* (2013.01); *H01L 27/20* (2013.01); *H01L 29/66075* (2013.01); *B81B 2201/0264* (2013.01); *B81B 2207/015* (2013.01); *B81C 2203/0735* (2013.01)

(56) References Cited

U.S. PATENT DOCUMENTS

2005/0287760 A1   12/2005   Yan et al.
2011/0250732 A1   10/2011   Klingner et al.

OTHER PUBLICATIONS

Written Opinion of International Application No. PCT/EP2011/054220, dated Sep. 22, 2012, 10 pp.
International Preliminary Report on Patentability from International Application No. PCT/EP2011/054220, dated Sep. 25, 2012, 12 pp.
Prosecution History from U.S. Pat. No. 9,034,680, dated Sep. 7, 2012 through Feb. 4, 2015, 76 pp.

METHOD FOR PRODUCING A MICROELECTROMECHANICAL DEVICE AND MICROELECTROMECHANICAL DEVICE

This application is a continuation of U.S. patent application Ser. No. 13/583,384, filed Nov. 21, 2012, which is a 371 National Phase Application based on International Application PCT/EP2011/054220, filed Mar. 21, 2011, which claims priority to European Application 10157193.3, filed Mar. 22, 2010. U.S. application Ser. No. 13/583,384 is assigned of record to ELMOS Semiconductor AG. The entire content of U.S. patent application Ser. No. 13/583,384 is incorporated herein by reference.

The invention relates to a micro-electromechanical device and a method for producing a micro-electromechanical device.

In a general way, the invention relates to a micro-electromechanical device which is compatible with conventional semiconductor processes and comprises micromechanical components adjusted with high precision relative to microelectronic components monolithically integrated into the device. A special exemplary embodiment of such a micro-electromechanical device is a micromechanical CMOS pressure sensor with low production tolerances.

In micro-electromechanical devices, the exact relative positioning of electronic components integrated in a semiconductor substrate, particularly of piezoresistive resistors or transistors, relative to micromechanical structures also integrated in the semiconductor substrate, is of considerable importance for the correct functioning of the device. Such micro-electromechanical devices comprise micromechanical components whose function is influenced, on the one hand, intentionally e.g. due to mechanical material stresses, i.e. for constructional reasons, but, on the other hand, also by parasitic effects. Typically, in the field of micro-electromechanics, the electronic and micromechanical components are produced in a planar manner by photolithography. The micromechanical components can comprise e.g. plates, membranes and bars which are clamped on all sides or are not clamped on all sides, as well as more-complex forms. As examples of such micromechanical components, there can be mentioned unilaterally clamped bars (beams, cantilevers) for oscillating systems, pressure membranes for pressure sensors, or centrally supported circular disks for oscillators.

The micromechanical production of these micromechanical components and respectively structures, when seen in relation to the absolute dimensions of the micromechanical components which typically are in the μm or maximally in the mm range, has considerably higher relative production tolerances than is the case in conventional non-micromechanical devices. In this respect, when designing the production processes, special care has to be taken that the concept and the production methodology are selected to the effect that the resultant process construction will—with regard to the process result (i.e. the micro-electromechanical device)—react in a robust manner on said unavoidable parameter variations. In this context, the construction of the device which is to be produced goes hand in hand with the process construction; both are not entirely separable.

Particularly for such micromechanical components wherein the amounts of mechanical material stresses can be detected by measurement technology whereas the local area of occurring maximal mechanical stresses that is provided for this purpose cannot be homogenized but is nonetheless of importance under the functional or parasitic aspect, the position of the microelectronic components sensitive to mechanical material stresses relative to the position of the micromechanical components exposed to the material stresses has to be controlled in such a manner that no relevant manufacturing tolerances will occur and there will thus also not be any relevant consequences of a misadjustment between the microelectronic and the micromechanical components.

It is an object of the invention to couple the micromechanical structural and respectively constructional elements, which are relevant for the functionality of micro-electromechanical devices, to microelectronic structural and respectively constructional elements by means of a process construction in such a manner that virtually no adjustment errors due to self-adjustment can occur anymore.

To achieve the above object, there is proposed, in accordance with the invention, a method for producing a micro-electromechanical device in a material substrate suitable for producing integrated electronic components, in particular a semiconductor substrate, wherein, in said method a material substrate is provided on which at least one surface structure is to be formed during production of the device, at least one electronic component is formed in the material substrate using process steps of a conventional method for producing integrated electronic components, a component element defining the position of the electronic component and/or required for the function of the electronic component is selectively formed on the material substrate within the active region from a first etching stop material acting as an etching stop in case of etching of the material substrate and/or in case of etching of a material layer disposed on the material substrate, when forming the component element of the electronic component, a bounding region is formed from said etching stop material also on the material substrate along at least a partial section of an edge of the surface structure, said bounding region bounding said partial section, and the material substrate thus formed is selectively etched for forming the surface structure, in that an edge of the bounding region defines, on the material substrate, the position of the surface structure to be formed.

According to the method of the invention, both micromechanical and microelectronic components will be integrated in a material substrate. In the normal case, the micromechanical components are defined by a surface structure which is generated in the course of the production process on a permanent or also a temporary basis. This means that the produced device does not necessarily have to comprise said surface structure but, instead, said structure merely has to exist during production. The surface structure is defined e.g. by at least one edge and can comprise at least one depression and/or at least one elevation. In case of a depression and respectively elevation, this depression or elevation can be enclosed on all sides or partly, or, in the simplest case, be formed as a step. In a pressure sensor comprising a membrane which is clamped on all sides and bridges a chamber, the micromechanical components are configured as so-called race tracks which are depressions formed in the material substrate in order to make the membrane thinner in its region near the chamber wall and thus to give more flexibility to the membrane. These depressions extend along the region of the membrane adjoining the chamber wall wherein, between at least two neighboring depressions, one or a plurality of electronic components for sensing mechanical tensions are arranged in the membrane, which tensions are generated in case of a deformation of the membrane as a result of a pressure or force exerted onto the membrane. However, the invention is not limited to the application for a pressure sensor.

The invention provides that, for producing a microelectromechanical device, use is made of a planar semiconductor process with photolithography. Such processes comprise process steps wherein, on the (usually, semiconductor) substrate, there will either be deposited material which then will be structured, or material will be deposited directly in a structured manner. The relative position (in x- and y-directions) of the individual "material islands" of a thus structured material layer is, due to the process, of a high precision. According to the invention, exactly this property is now utilized to achieve the relative position of the micromechanical (surface) structures relative to the microelectronic components in a self-adjusting manner.

This is accomplished in that a first (etching stop) material is used which defines the position of an electronic component (within an active layer formed in the material substrate) and/or is required for the function of the electronic component but is used also for the bounding and respectively the positional definition of the micromechanical (surface) structure, with this structure being formed in the material substrate by etching; wherein this process step can be employed for preparation of the material substrate for the purpose of the later formation/completion of the surface structure. In the (later) etching process, this material has to function as a mask for the material of the substrate disposed below the etching stop material. For instance, said first material can be an electrically conductive material serving e.g. as the gate of a piezoresistive transistor, or as a resistance layer or field shield of a piezoresistive resistor. Thus, the—in this case— electrically conductive material has to function as an etching stop mask against the material substrate (e.g. semiconductor substrate) when the micromechanical (surface) structure (e.g. depression or step) is being formed by an etching process.

In case of a CMOS planar process performed on a silicon substrate, said first (etching stop) material can be a polycrystalline silicon (hereunder referred to as polysilicon). In the normal case, the upper side of the semiconductor substrate, e.g. for protecting the integrated structures, is provided with a passivation layer. However, there can be applied also other functionally effective types of material layers made of a respective adapted material. For forming a e.g. depression (as a surface structure) by etching, it is first required to generate, in said passivation layer, an opening aligned with the depression to be formed later on. This is performed by photolithography and by etching, while the polysilicon of the bounding region as well as the silicon substrate itself serves as an etching stop. Then, by use of another material (gaseous or liquid), the depression will be etched into the silicon substrate. During this process, now, the polysilicon of the bounding region would have to serve as an etching mask and for protection of the underlying silicon substrate. However, such materials which have selective etching effects of different strengths, can be produced only with considerable expenditure so that another mechanism has to be found, except that, instead of using the polysilicon, there would be used another material which can serve both as a component element for the microelectronic component and as an etching stop material for the bounding region.

Thus, when using polysilicon, it is suitable if, on the material substrate in the region of the surface structure (e.g. depression) to be formed later, there is applied a second etching stop material which will at least delay an etching process. This second etching stop material can be e.g. silicon oxide which is formed thermally or by deposition, as is known from production processes for silicon component elements. Now, if this second etching stop material is situated below the bounding region made of the first etching stop material, this has the effect that, when the opening is being etched into the passivation layer, it is not only that the passivation layer will be etched all the way to the first etching stop material but also that said second etching stop material will be etched all the way to the silicon semiconductor material. Thus, the structure of the bounding region has been transferred onto the silicon semiconductor substrate. When, subsequently, for generating the surface structure in and/or on the silicon semiconductor substrate, the latter will be etched, the second etching stop material will act as a mask for the shaping of the surface structure.

The material above referred to as a second "etching stop material" does not necessarily have to be completely resistant to those etching methods or etching agents which are used for etching the depression into the material substrate. It is sufficient if this second etching stop material is less sensitive to the etching method and respectively etching agent used for etching the depression than the material substrate. By suitable selection of the thickness of said second etching stop material in relation to the depth of the depression to be etched into the material substrate, and of the relation of the etching rates of the first and second etching stop materials, it can thus be achieved that, up to the time when e.g. a depression has been etched into the material substrate with the desired penetration depth, the second etching stop material will not yet have been fully "etched through".

Thus, as provided by an advantageous variant of the invention, it is possible—as already mentioned—to apply onto the material substrate a layer (e.g. passivation layer) in which, in preparation of the forming of the surface structure, an opening will be formed, particularly by etching, said opening being aligned with the surface structure (e.g. depression) to be generated in the material substrate, and, via said opening of the (passivation) layer, said surface structure can be etched into the region of the material substrate delimited by the bounding region.

As also already described above, it is possible, according to a further variant of the invention, while using substantially identical materials for the material substrate and for the first etching stop material, to form, below the bounding region defining the position of the surface structure, a second etching stop material on the material substrate, with the bounding region being at least partially formed on said second etching stop material, wherein, during an etching process for etching the surface structure into the material substrate or for pretreatment of the material substrate for the (subsequent) forming of the surface structure, said second etching stop material will be etched off with a lower rate than that with which the material substrate is etched.

A further variant of the invention provides that, as a surface structure, at least one depression can be formed in the upper side of the material substrate, wherein a chamber will be formed, preferably by etching, in the bottom side of the material substrate, so that, on the whole, there is generated a material substrate comprising a covered chamber, wherein said depression will be arranged within the region of the material substrate bridging the chamber. In this manner, an absolute or relative pressure sensor can be produced. Said chamber can be open on one side or can be formed as a so-called "buried cavity".

To achieve the object indicated further above, there is also proposed, in accordance with the invention, a micro-electromechanical device comprising
- a substrate having a top side and a bottom side,
- at least one electronic component integrated in the substrate and comprising a component element made of a first material, said component element defining the position of said component and/or being required for the function thereof, and
- at least one surface structure formed in and/or on the upper side of the substrate and comprising a bounding edge or a bounding edge portion,
- there being formed in the substrate, on the upper side of the substrate and/or in the region near the upper side of the substrate along said bounding edge or said bounding edge portion of the surface structure, a bounding region made of said first material and laterally defining said bounding edge or said bounding edge portion of the surface structure.

According to one embodiment of the invention, said electronic component is a transistor comprising a gate and said component element is the gate of said transistor, or said electronic component is a resistor and said component element is a resistance layer, e.g. a polysilicon resistance layer, or a field shield of said resistor.

According to a further embodiment of the invention, said first (etching stop) material is e.g. electrically conductive and preferably comprises polycrystalline silicon. Along a bounding edge or bounding edge portion of the surface structure in the substrate, there extends a further region, said further region being made of a second material which is electrically insulating and preferably comprises silicon oxide and which has said first material arranged on it. By way of alternative, one can also use metal for said first (etching stop) masking material (e.g. Al). In this case, no need exists for the second etching stop material. The metal can be used e.g. as the gate of a transistor and at the same time (in the same process step) can be applied and respectively generated as material for the bounding region laterally delimiting the etching.

Further, according to an advantageous embodiment of the invention, a chamber is formed on the bottom side of the substrate, the surface structure comprising at least one depression within a region of the substrate bridging said chamber.

Figure 2:
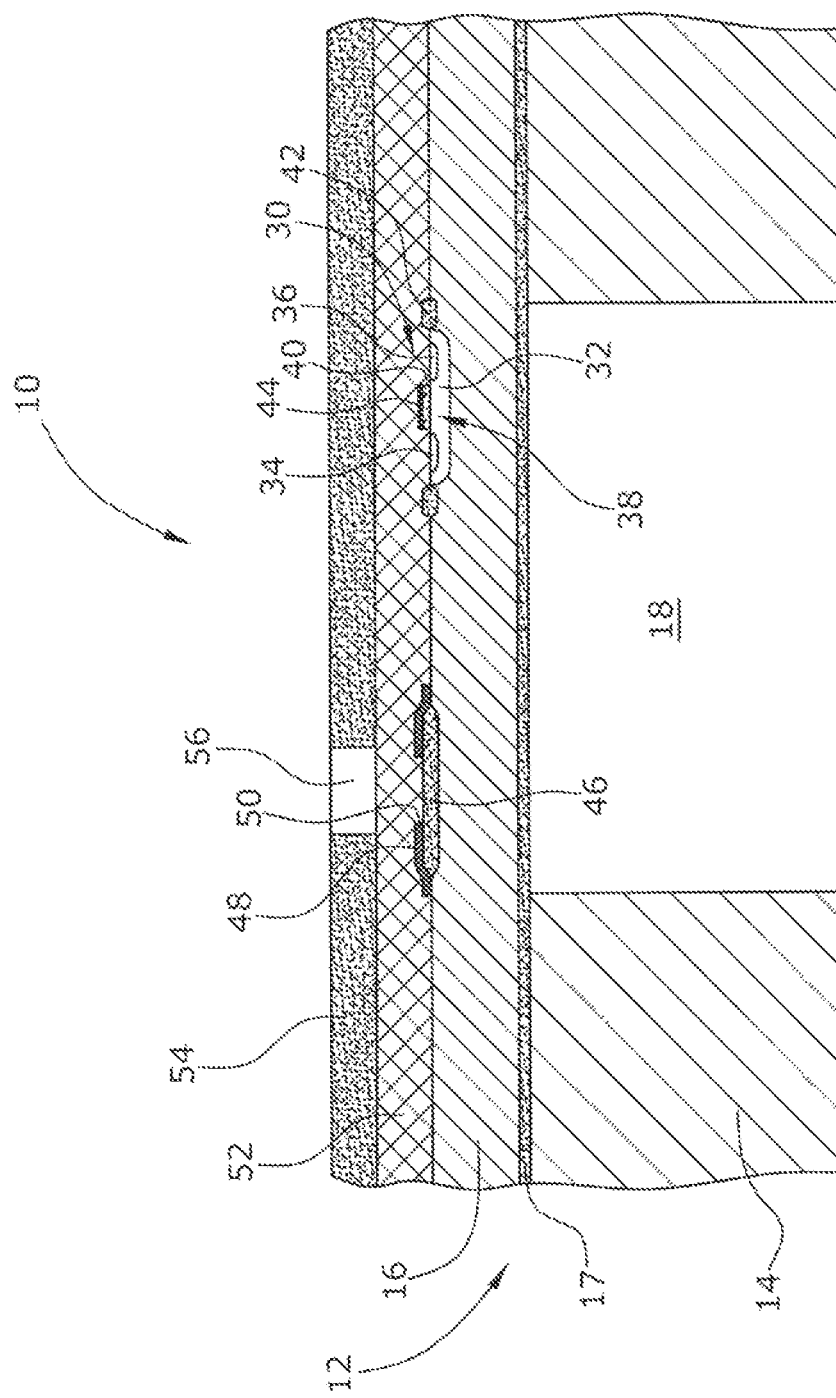
Figure 3:
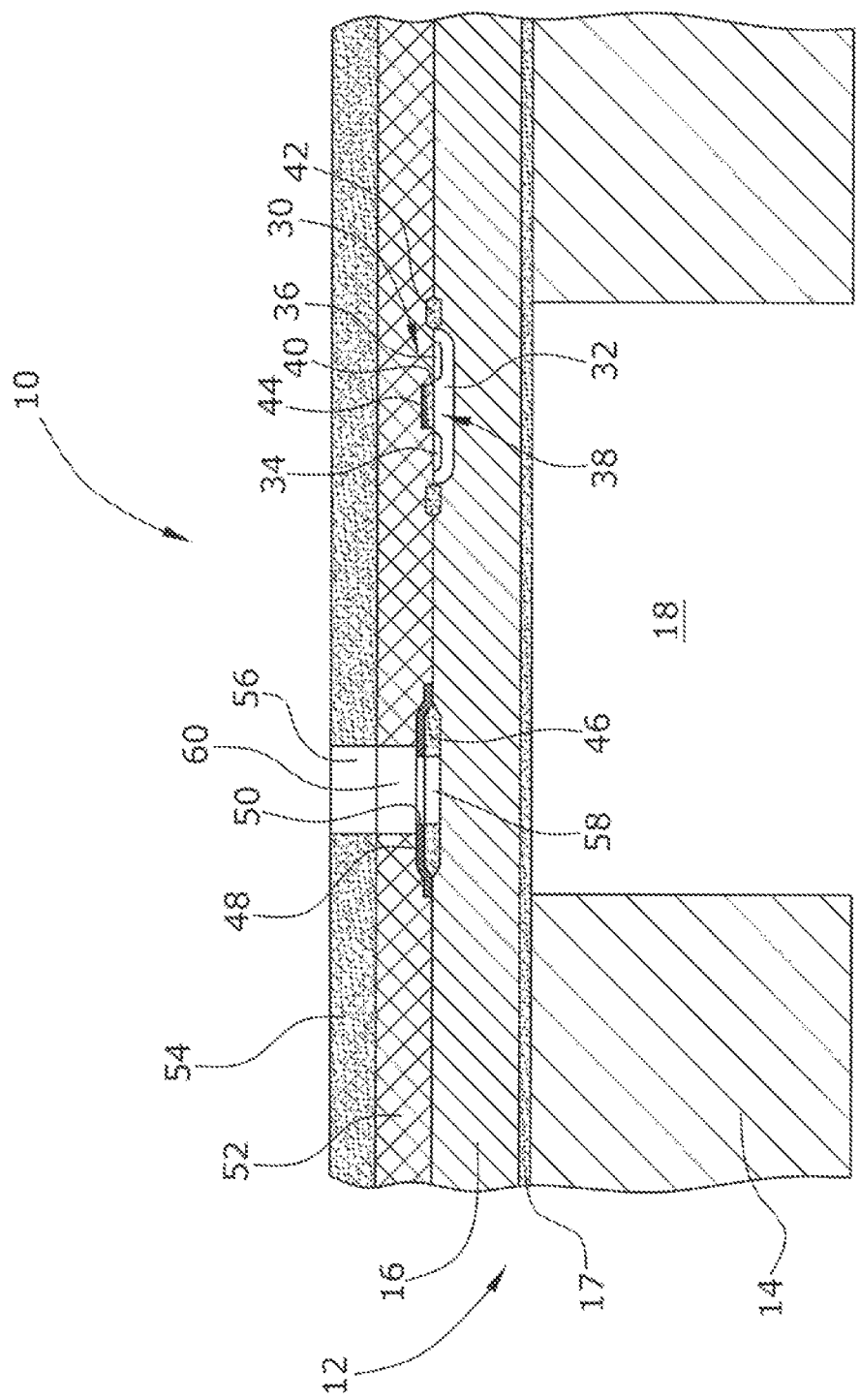
Figure 4:
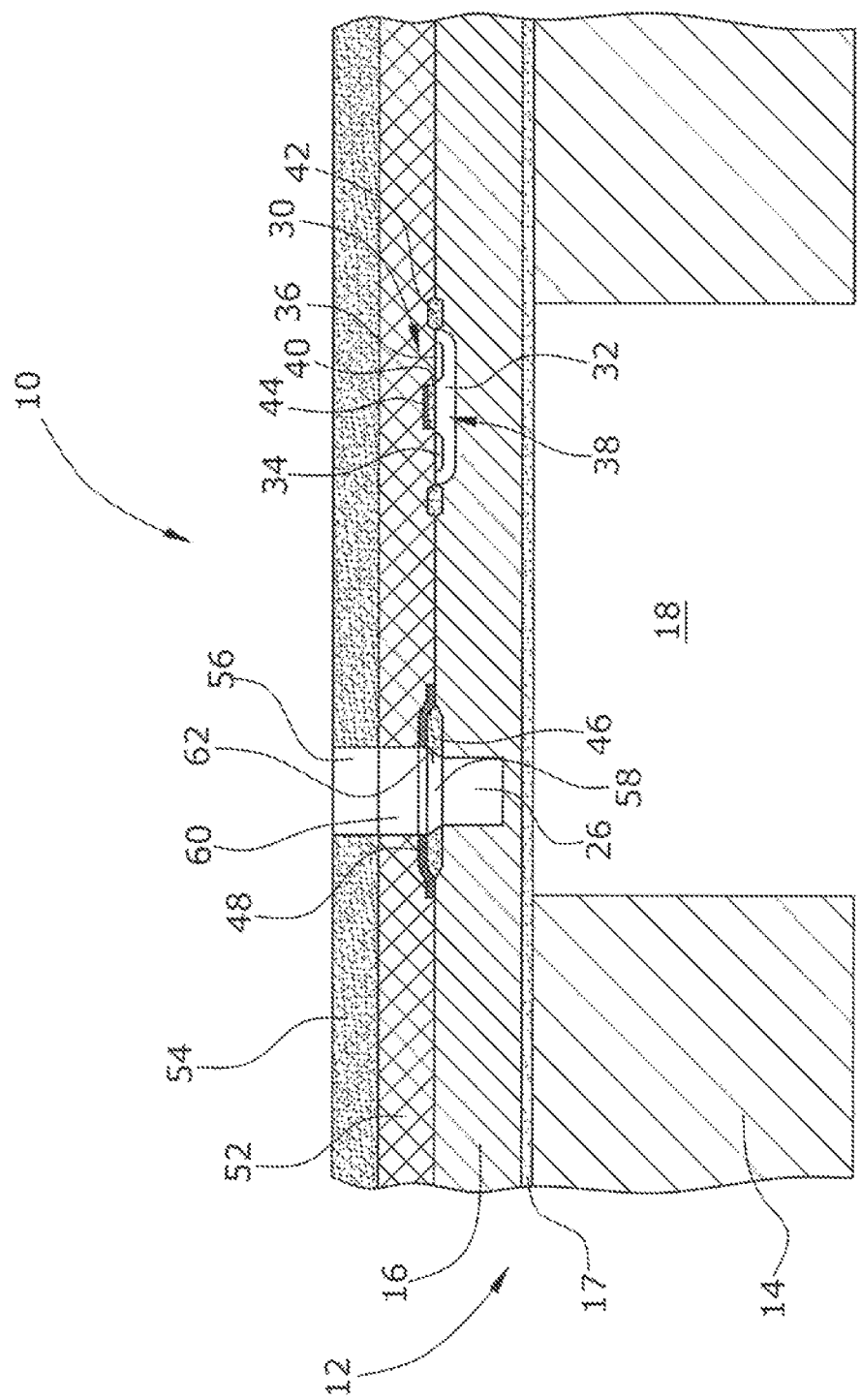
Figure 5:
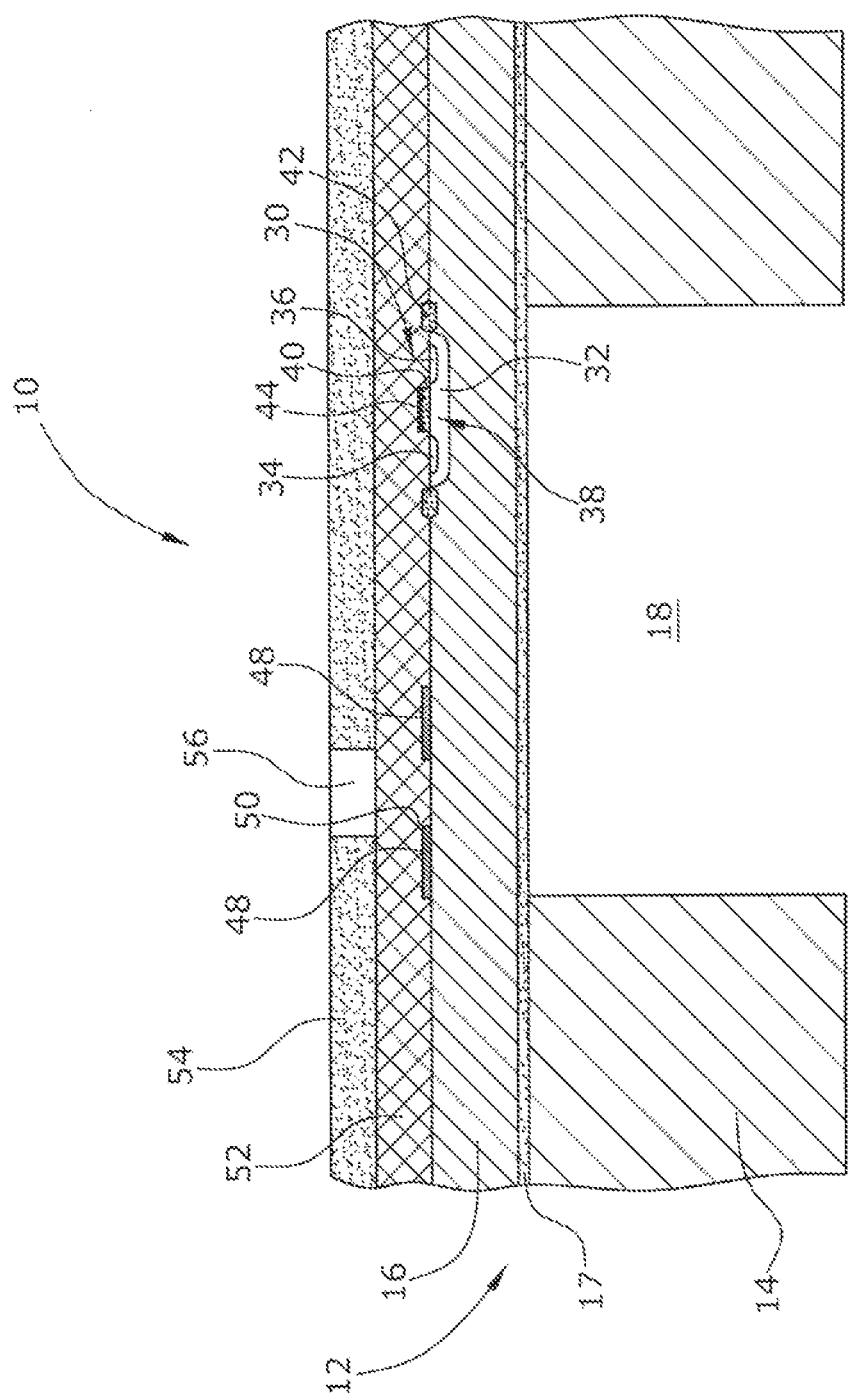
Figure 6:
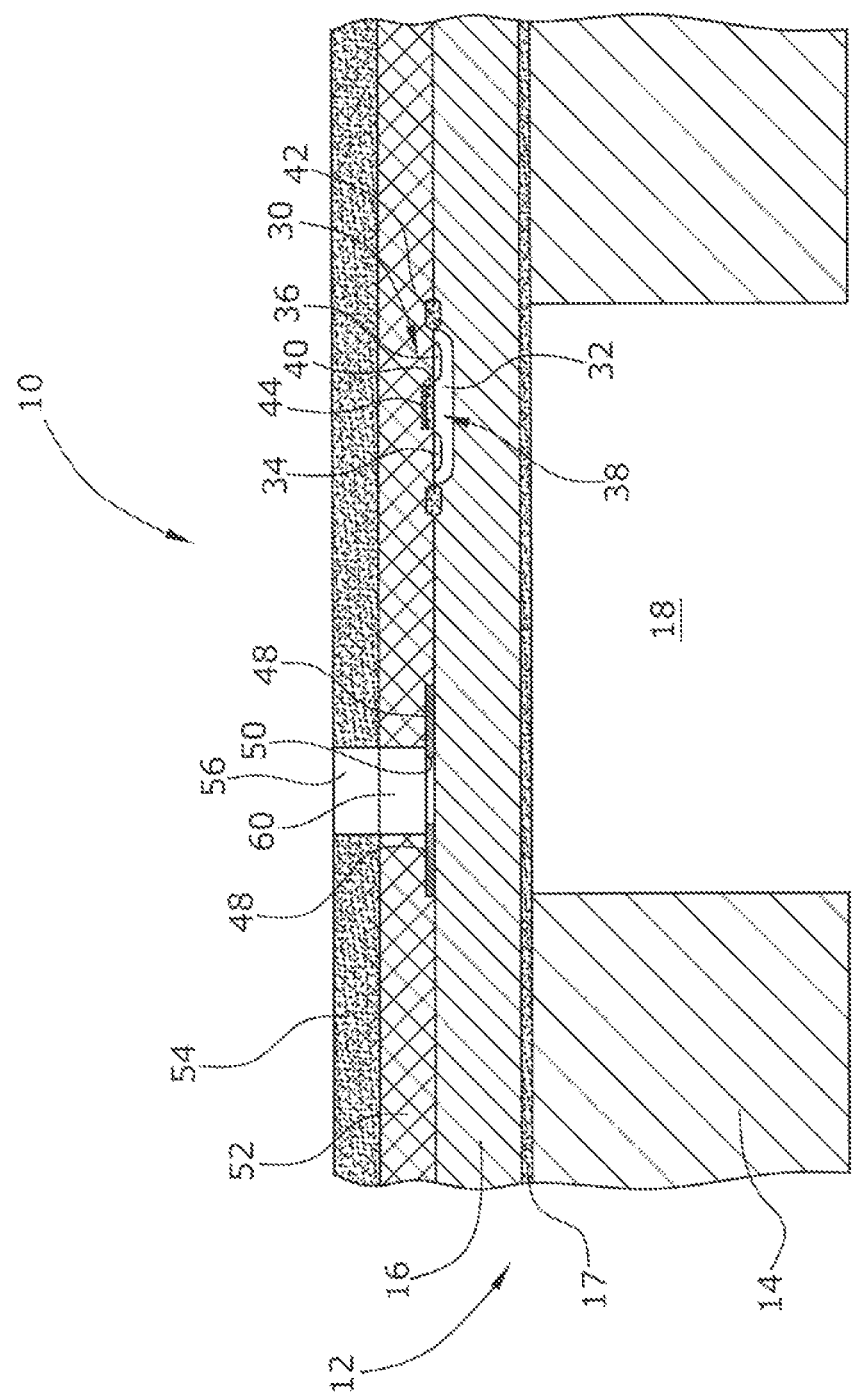
Figure 7:
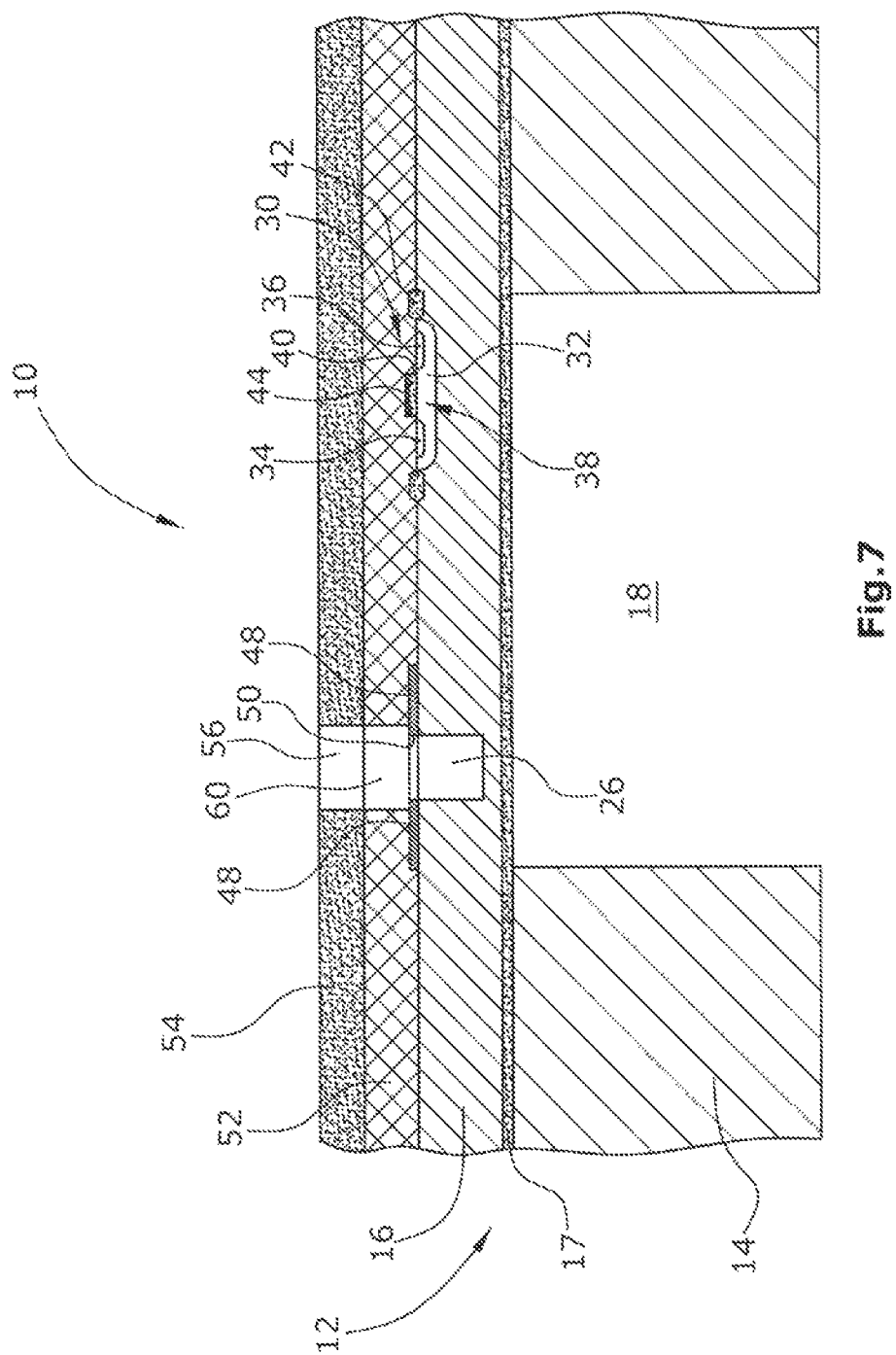

The invention will be explained in greater detail hereunder by way of two exemplary embodiments wherein the micromechanical surface structures each comprise a plurality of depressions, and with reference to the drawing. In the several views of the drawing, the following is shown:

FIG. 1 is a perspective sectional view of a micro-electromechanical pressure sensor as an example of a micro-electromechanical device, FIGS. 2-4 are sectional views of the semiconductor substrate of the micro-electromechanical pressure sensor of FIG. 1 in various process stages according to a first example of a production process, and FIGS. 5-7 are sectional views of the semiconductor substrate of the micro-electromechanical pressure sensor of FIG. 1 in various process stages according to a second example of a production process.

FIG. 1 schematically shows the design of a micro-electromechanical pressure sensor 10 formed in an SOI semiconductor substrate 12. The SOI semiconductor substrate 12 is subdivided into a so-called handle wafer 14 made of silicon, a top wafer 16 made of silicon (sometimes also referred to as a device wafer), and an $SiO_2$ layer 17 arranged between said two wafers. The two wafers 14,16 are bonded to each other by said $SiO_2$ layer 17. Within said handle wafer 14, a chamber 18 is formed which in the present embodiment is open on one side. On the other hand, said chamber 18 could also be closed on the bottom side 20 of the handle wafer 14.

Said top wafer 16 bridges the chamber 18 formed in handle wafer 14 and in this region is designed as a pressure- and respectively force-sensitive deformable membrane 22. For this purpose, trenches or generally depressions 26, also called "race tracks", are formed in the SOI substrate 12 from the top side 24 of top wafer 16. By these depressions 26, the thickness of membrane 22 in the edge regions thereof is reduced, while material webs 28 remain between adjacent trenches or depressions 26. In the region of at least one of said material webs 28, there is integrated a—in this embodiment, piezoresistive—microelectronic component 30 which in this embodiment is designed as a transistor.

With reference to the various cross-sectional views shown in FIGS. 2 to 4, a possible production process of pressure sensor 10 according to FIG. 1 will be explained hereunder. The line along which the cut has been made through the pressure sensor as shown in FIGS. 2 to 4, extends as indicated at II-II in FIG. 1.

In an active region 32 formed within the region of the web 28 (e.g. an n-doped well), a transistor 30 is arranged. Transistor 30 comprises drain and source connection regions 34,36 as well as a gate region 38 with a gate oxide 40 arranged above it. Said active region 32 is surrounded by field oxide 42 and thus is laterally limited, as is known e.g. from state-of-the-art transistors produced in a CMOS process. Arranged on the gate oxide 40 is a gate electrode 44, made e.g. of polysilicon, which defines the position of transistor 30 within the active region 32.

Now, according to the invention, prior to the depositing of the polysilicon for the gate electrode 44 of transistor 30 (and for other microelectronic structures of pressure sensor 10), it is provided that, in an e.g. self-adjusting CMOS process, a material—subsequently referred to as a hard mask 46—will be deposited and then be structured, or will be deposited in a structured manner, on those sites on the top wafer 16 into which a depression 26 is to be etched from above. In the present case, said material is a thermal oxide or a CVD oxide, as also used for the field oxide 42 of transistor 30. When, in a later process step of the CMOS process, polysilicon and particularly the polysilicon provided for the polysilicon gate 44 of transistor 30 will be deposited, this polysilicon will be deposited also on the hard mask 46, as is shown in FIG. 2. The polysilicon deposited on the hard mask 46 will delimit, in the form of a bounding region 48, an opening 50 defining the position of the depressions 26 to be formed by etching within later process steps. The upper side of the SOI semiconductor substrate 12 will be covered by a passivation layer 52 (e.g. of silicon nitride).

Now, for preparation of the forming of the depressions 26 by etching, a lacquer mask 54 will now be applied on the passivation layer 52 and will be photolithographically structured to the effect that the lacquer mask 54 will have openings 56 at the sites aligned with the depressions 26 to be etched later. In FIG. 2, the described exemplary (differential) pressure sensor 10 on silicon basis is schematically shown in this process stage.

To allow for the etching of the depressions 26 into the top wafer 12, it is first required to perform an etching through the passivation layer 52 and the hard mask 46 down to the silicon of the top wafer 12. In the process, the polysilicon of the bounding region 48 as well as the silicon of the top wafer 16 will act, so-to-speak, as an etching stop, wherein, as a result, the opening defined by the bounding region 48 of polysilicon will be transferred onto the upper side of the silicon of the top wafer 16. Thus, in other words, the polysilicon of bounding region 48 will mask the etching in such a manner that only at those sites where the lacquer mask 54 is open (openings 56), and on the hard mask 46 thereunder, no polysilicon will exist (i.e. in the region of the opening 50 of the bounding region 48) and the etching will pass through the hard mask 46 in which there will thus be generated the opening 50. Thus, the structures of the hard mask 46 will be correlated in position and dimension with—and will be automatically adjusted to—the position and dimension of the opening 50 in the bounding region 48. Since the position of the bounding region 48 and thus its opening 50 in turn correlate with—and are automatically adjusted to—the position of gate 44 of transistor 30, there will thus be achieved a highly precise and reproducible relative position of the opening 50 and the transistor gate 44. The condition after the above described process step, i.e. after the process of etching down to the silicon (polysilicon of bounding region 48 and respectively silicon of top wafer 16) is shown in FIG. 3.

Starting from this condition, there will now be generated the depressions 26 in the silicon of the top wafer 16. In this regard, a certain problem exists in that the etching agents which is now used (as a gaseous or liquid phase), apart from effecting the desired etching in the silicon of the top wafer 16, will also undesirably attack the polysilicon of the bounding region 48. This polysilicon, as can be gathered from FIG. 3, extends into the window 60 of passivation layer 52 that has been etched according to FIG. 3. This will cause a widening of the opening 50 of the bounding region 48 of polysilicon, which per se is not desired. However, the likewise undesired transfer of this widened opening all the way to the silicon of the top wafer 16 through the hard mask 46 and respectively through the widening of the opening 58 of the hard mask can be prevented by making use of the different etching rates with which silicone is etched as compared to the material of the hard mask 46. Thus, one should use an etching agent or etching method to which and respectively in which the material of the hard mask 46 is either resistant or (distinctly) less sensitive than silicon. Such etching agents are known in the state of the art.

Normally, the depths of the depressions 26 to be etched are in an order of magnitude of several μm. Thus, when selecting the thickness of the hard mask 46, care should be taken that the hard mask 46, under consideration of the selectivity of the etching of polysilicon and silicon one the one hand as compared to the etching of $SiO_2$ on the other hand has a sufficient thickness and will not be etched through. The openings of the lacquer mask 54, however, should advantageously be larger than the size of the depressions 26 to be etched because, in this case, adjustment errors of the lacquer mask 54 relative to the bounding region 48 will have no influence anymore on the later position of the depressions 26. This means that the polysilicon bounding regions 48 are wider than the variation range of the adjustment errors of the lacquer mask 54 relative to the polysilicon structures.

By the above outlined general boundary conditions for the selection of the thickness of the hard mask 46 (under further consideration of the amount of the difference of the etching rates in the material of the hard mask 46 and in the silicon), the thickness of the hard mask 46 can thus be selected to the effect that the hard disk will not yet have been fully "etched through" when the desired depth of the depressions 26 has been reached. Thus, after etching, there will still remain residual material of the hard mask 46 on the silicon of the top wafer 16 along the edge of the depression 26, which has the effect that the position of the depression 26 is, as desired, the same as it was before the etching of the depression 26. Constructionally, this is embodied by an oblique surface, or by a surface 62 comprising one or a plurality of steps, along the upper bounding edge of the depression 26. Said surface 62 is arranged along the edge of the opening 58 within the hard mask 46. This situation is shown in FIG. 4.

With reference to FIGS. 5 to 7, an alternative process for producing a pressure sensor 10 according to FIG. 1 will be briefly discussed hereunder.

This process resembles the one according to FIGS. 2 to 4. According to FIGS. 5 to 7, in difference to the latter process according to FIGS. 2 to 4, there is used, instead of polysilicon, a metal (e.g. aluminum or an aluminum alloy) for the transistor gates. The advantage of the use of aluminum or another metallic material as a material for the bounding region 48 resides in that the hard mask 46 of the above described process can be omitted. This is because, starting from the situation according to FIG. 5, it is now again possible to first perform the etching down to the silicon of the top wafer 16, wherein the material of the bounding region 48, in a manner similar to the silicon, acts as an etching stop. Thus, after this etching process, the process stage according to FIG. 6 has been reached.

Starting from this condition, the silicon of the top wafer 16 will now be etched so as to form the depressions 26. In the process, the bounding region 48 is maintained, i.e. it serves directly as a mask (FIG. 7).

Thus, the invention is defined by any one of the groups of features mentioned hereunder (and/or a random combination thereof):

1. A method for producing a micro-electromechanical device in a material substrate suitable for producing integrated electronic components, in particular a semiconductor substrate, wherein, in said method
   a material substrate 12,14,16 is provided on which at least one surface structure 26 is to be formed during production of the device,
   at least one electronic component 30 is formed in the material substrate 12,14,16 using process steps of a conventional method for producing integrated electronic components,
   a component element 44 defining the position of the electronic component 30 and/or required for the function of the electronic component 30 is selectively formed on the material substrate 12,14,16 from a first etching stop material acting as an etching stop in case of etching of the material substrate 12,14,16 and/or in case of etching of a material layer 52 disposed on the material substrate 12,14,16,
   when forming the component element 44 of the electronic component 30, a bounding region 48 is formed from said etching stop material also on the material substrate 12,14,16 along at least a partial section of an edge of the surface structure 26, said bounding region bounding said partial section, and
   the material substrate 12,14,16 thus formed is selectively etched for forming the surface structure 26, in that an edge of the bounding region 48 defines, on the material substrate, the position of the surface structure 26 to be formed.

2. The method according to item 1, wherein, on the material substrate 12,14,16, a material layer 52 is applied in which, in preparation of the forming of the surface structure 26, an opening 60 aligned with an edge or edge portion of the surface structure 26 is generated preferably by etching, and wherein, in the region of the material substrate 12,14,16 delimited by the bounding region 48, said edge or edge portion of the surface structure 26 is etched on the material substrate via said opening 60 of the material layer 52.

3. The method according to items 1 or 2, wherein, with substantially identical materials for the material substrate 12,14,16 and for the first etching stop material, there is formed, below the bounding region 48 defining the position of an edge or edge portion of the surface structure 26, a second etching stop material 46 on the material substrate 12,14,16, with the bounding region 48 being at least partially formed on said second etching stop material, and wherein, during an etching process for etching the edge or edge portion of the surface structure 26 into the material substrate 12,14, 16, said second etching stop material 46 is etched off, notably with a lower rate than that with which the material substrate 12,14,16 is etched.

4. The method according to item 3, wherein the material substrate 12, 14,16 is a crystalline silicon and the first etching stop material is a polycrystalline silicon, and wherein the second etching stop material 46 is silicon oxide.

5. The method according to any one of items 1 to 4, wherein the material substrate 12,14,16 has a bottom and a top side 20,24 and wherein the surface structure 26 comprises at least one depression which is formed in the top side 24 of the material substrate 12,14,16, and wherein a chamber 18 is formed in the bottom side 20 of the material substrate 12,14,16, preferably by etching, said at least one depression of the surface structure 26 being arranged within the region 22 of the material substrate 12,14,16 bridging said chamber 18.

6. A micro-electromechanical device comprising
    a substrate 12,14,16 having a top side 24 and a bottom side 20,
    at least one electronic component 30 integrated in the substrate 12,14,16 and comprising a component element 44 made of a first material, said component element defining the position of said component 30 and/or being required for the function thereof, and
    at least one surface structure 26 formed in and/or on the top side 24 of the substrate 12,14,16 and comprising a bounding edge or a bounding edge portion,
    there being formed in the substrate 12,14,16, on the top side 24 of the substrate 12,14,16 and/or in the region near the upper side of the substrate along said bounding edge or said bounding edge portion of the surface structure 26, a bounding region 48 made of said first material and laterally defining said bounding edge or said bounding edge portion of the surface structure 26.

7. The device according to item 6, wherein said electronic component 30 is a transistor comprising a gate and said component element 44 is the gate of said transistor, or wherein said electronic component 30 is a resistor and said component element is a resistance layer of said resistor.

8. The device according to items 6 or 7, wherein said first material is electrically conductive and preferably comprises polycrystalline silicon and wherein a further region 46 extends along the bounding edge or bounding edge portion of the surface structure 26 in the substrate 12, 14,16, said further region being made of a second material which is electrically insulating and preferably comprises silicon oxide and which has said first material arranged on it.

9. The device according to any one of items 6 to 8, wherein the surface structure 26 comprises at least one depression and wherein a chamber 18 is formed on the bottom side 20 of the substrate 12,14,16 and wherein said at least one depression of the surface structure 26 is arranged within a region 22 of the substrate 12,14,16 bridging said chamber 18.

10. A method for producing a micro-electromechanical device in a material substrate suitable for producing integrated electronic components, in particular a semiconductor substrate, wherein, in said method
    a material substrate 12,14,16 is provided on which at least one depression 26 is to be formed at least temporarily during production of the device,
    at least one electronic component 30 is formed in the material substrate 12,14,16 using process steps of a conventional method for producing integrated electronic components,
    a component element 44 defining the position of the electronic component 30 and/or required for the function of the electronic component 30 is selectively formed on the material substrate 12,14,16 from a first etching stop material acting as an etching stop in case of etching of the material substrate 12,14,16 and/or in case of etching of a material layer 52 disposed on the material substrate 12,14,16,
    when forming the component element 44 of the electronic component 30, a bounding region 48, extending along the depression 26 to be formed in the material substrate 12,14,16, is generated from said etching stop material also on the material substrate 12,14,16 along at least a partial section of a bounding edge of the depression 26 to be formed, said bounding region bounding said partial section, and
    the material substrate 12,14,16 thus formed is selectively etched for forming the depression 26, in that an edge of the bounding region 48 defines the position of the etched depression 26.

11. The method according to item 10, wherein, on the material substrate 12,14,16, a material layer 52 is applied in which, in preparation of the forming of the depression 26, an opening 60 aligned with an edge or edge portion of the depression 26 is generated preferably by etching, and wherein, in the region of the material substrate 12,14,16 delimited by the bounding region 48, at least said edge or edge portion of the depression 26 is etched into the material substrate via said opening 60 of the material layer 52.

12. The method according to items 10 or 11, wherein, with substantially identical materials for the material substrate 12,14,16 and for the first etching stop material, there is formed, below the bounding region 48 defining the position of an edge or edge portion of the depression 26, a second etching stop material 46 on the material substrate 12,14,16, with the bounding region 48 being at least partially formed on said second etching stop material, and wherein, during an etching process for etching at least the edge or edge portion of the depression 26 into the material substrate 12,14,16, said second etching stop material 46 is etched off, notably with a lower rate than that with which the material substrate 12,14,16 is etched.

13. The method according to item 12, wherein the material substrate 12, 14,16 is a monocrystalline silicon and the first etching stop material is a polycrystalline silicon, and wherein the second etching stop material 46 is silicon oxide.

14. The method according to any one of items 10 to 13, wherein the material substrate 12,14,16 has a bottom and a top side 20,24, wherein said at least one depression 26 is formed in the top side 24 of the material substrate 12,14,16, and wherein a chamber 18 is formed in the bottom side 20 of the material substrate 12,14,16, preferably by etching, said depression 26 being arranged within the region 22 of the material substrate 12,14,16 bridging said chamber 18.

15. A micro-electromechanical device comprising
a substrate 12,14,16 having a top side 24 and a bottom side 20,
at least one electronic component 30 integrated in the substrate 12, 14,16 and comprising a component element 44 made of a first material, said component element 30 defining the position of said component 30 and/or being required for the function thereof, and
at least one depression 26 formed in the top side 24 of the substrate 12,14,16 and comprising a bounding edge or a bounding edge portion,
there being formed in the substrate 12,14,16, on the top side 24 of the substrate 12,14,16 and/or in the region near the upper side of the substrate along said bounding edge or said bounding edge portion of the depression 26, a bounding region 48 made of said first material and laterally defining said bounding edge or said bounding edge portion of the depression 26.

16. The device according to item 15, wherein said electronic component 30 is a transistor comprising a gate and said component element 44 is the gate of said transistor, or wherein said electronic component 30 is a resistor and said component element is a resistance layer of said resistor.

17. The device according to items 15 or 16, wherein said first material is electrically conductive and preferably comprises polycrystalline silicon and wherein a further region 46 extends along the bounding edge of the depression 26 in the substrate 12,14,16, said further region being made of a second material which is electrically insulating and preferably comprises silicon oxide and which has said first material arranged on it.

18. The device according to any one of items 10 to 17, wherein a chamber 18 is formed on the bottom side 20 of the substrate 12,14,16 and wherein said at least one depression 26 is arranged within a region 22 of the substrate 12,14,16 bridging said chamber 18.

The invention claimed is:

1. A micro-electromechanical device comprising:
a material substrate including a surface structure located on a surface of the material substrate, wherein the surface structure comprises a depression having a vertical depression wall extending vertically from the surface of the material substrate into the material substrate, wherein a position of the depression is laterally defined by a first edge defined by the depression wall and the surface of the material substrate;
an electronic component arranged in the material substrate, wherein the electronic component comprises a component element having a third edge which defines a position of the electronic component in a predetermined relation to the first edge;
an etching stop material deposited on the material substrate or a material layer that is disposed on the material substrate;
a chamber; and
a bridging region,
wherein the material substrate has a bottom side and a top side,
wherein the depression of the surface structure is formed in the top side of the material substrate,
wherein the chamber is arranged in the bottom side of the material substrate,
wherein, within the bridging region, the top side of the material substrate bridges the chamber,
wherein the depression of the surface structure is arranged within the bridging region of the material substrate,
wherein the etching stop material is arranged so as to provide the third edge of the component element of the electronic component and a bounding region having a second edge extending along at least a partial section of the first edge,
wherein positions of the second edge and third edge have a predetermined relation relative to each other, and
wherein the second edge of the bounding region defines, on the material substrate, a position of the first edge in a predetermined relation to the third edge of the component element.

2. The micro-electromechanical device of claim 1, further comprising an opening aligned with at least a portion of an edge of the surface structure, wherein the at least a portion of the edge of the surface structure is arranged on the material substrate via the opening of the material layer.

3. The micro-electromechanical device of claim 1, wherein the etching stop material comprises a first etching stop material, the micro-electromechanical device further comprising:
a second etching stop material arranged on the material substrate,
wherein the material substrate and the first etching stop material comprise substantially identical materials,
wherein the bounding region defines a position of at least a portion of an edge of the surface structure,
wherein the bounding region is at least partially arranged on the second etching stop material.

4. The micro-electromechanical device of claim 3, wherein the material substrate includes monocrystalline silicon, the first etching stop material includes polycrystalline silicon, and the second etching stop material includes silicon oxide.

5. The micro-electromechanical device of claim 1, wherein the chamber is closed at the bottom side of the material substrate.

6. A micro-electromechanical device comprising:
a material substrate having a top side and a bottom side;
an electronic component integrated in the material substrate, the electronic component comprising a component element made of a first material; and
a surface structure formed in the top side of the material substrate or on the top side of the material substrate, the surface structure comprising a at least a portion of a bounding edge,
wherein the material substrate includes a bounding region comprising the first material,
wherein the bounding region is located on the top side of the material substrate or in a region near the top side of the material substrate, wherein the bounding region laterally defines the at least a portion of the bounding edge of the surface structure, wherein the surface structure comprises a depression, wherein a chamber is formed in the bottom side of the material substrate, and wherein the depression is arranged within a region of the material substrate that bridges the chamber.

7. The micro-electromechanical device of claim 6, wherein the electronic component includes a transistor comprising a gate and the component element includes the gate of the transistor.

8. The micro-electromechanical device of claim 6, wherein the electronic component includes a resistor and the component element includes a resistance layer of the resistor.

9. The micro-electromechanical device of claim 6, further comprising an electrically insulating region made of a second material, wherein the electrically insulating region extends along the bounding edge of the surface structure in the material substrate, wherein the first material is electrically conductive and is arranged on the second material.

10. The micro-electromechanical device of claim 6, wherein the first material comprises polycrystalline silicon and second comprises silicon oxide.

* * * * *